United States Patent [19]
Guicheteau

[11] 4,208,594
[45] Jun. 17, 1980

[54] POWER MONITOR FOR USE IN STARTING AND STOPPING A DIGITAL ELECTRONIC SYSTEM

[75] Inventor: Eugene H. Guicheteau, Audubon, Pa.
[73] Assignee: Honeywell Inc., Minneapolis, Minn.
[21] Appl. No.: 892,833
[22] Filed: Apr. 3, 1978
[51] Int. Cl.² .................. H03K 17/16; H03K 17/22; H03K 17/28
[52] U.S. Cl. .................. 307/200 A; 307/247 A
[58] Field of Search ............ 307/200 A, 200 B, 247 A

[56] References Cited
U.S. PATENT DOCUMENTS

| | | | |
|---|---|---|---|
| 3,544,720 | 12/1970 | Corderman | 307/200 A |
| 3,555,306 | 1/1971 | Cogar et al. | 307/247 A |
| 3,909,674 | 9/1975 | Spence et al. | 307/200 B |
| 3,925,682 | 12/1975 | Hamada | 307/247 A |

*Primary Examiner*—John S. Heyman
*Attorney, Agent, or Firm*—L. J. Marhoefer

[57] ABSTRACT

A power monitor for providing a low impedance path to ground for a digital electronic system under certain circumstances dependent upon the status of the A.C. energization has a normally closed semiconductor switch coupled between the digital electronics system and ground. A bias voltage derived from the regulated D.C. power supply is delayed and applied to the switch to open it a predetermined interval after the A.C. is turned on. The bias is removed from the switch when the A.C. power is turned off prior to the time the regulated D.C. outputs deviate substantially from their nominal values.

1 Claim, 4 Drawing Figures

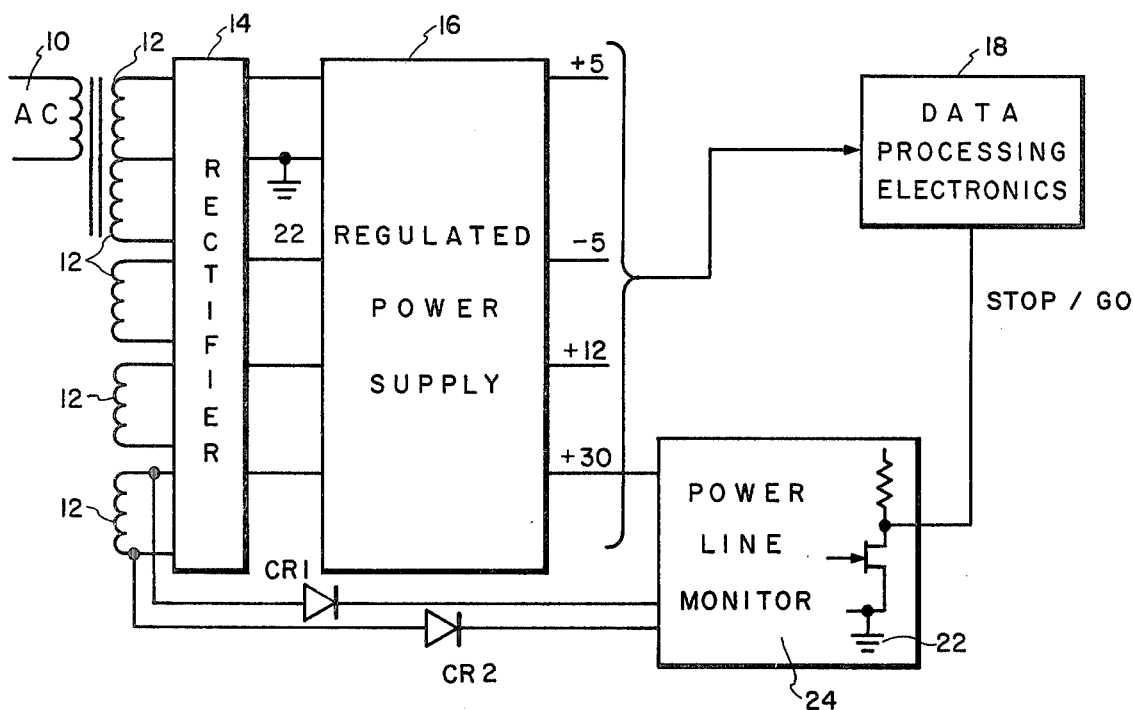
F I G. 1
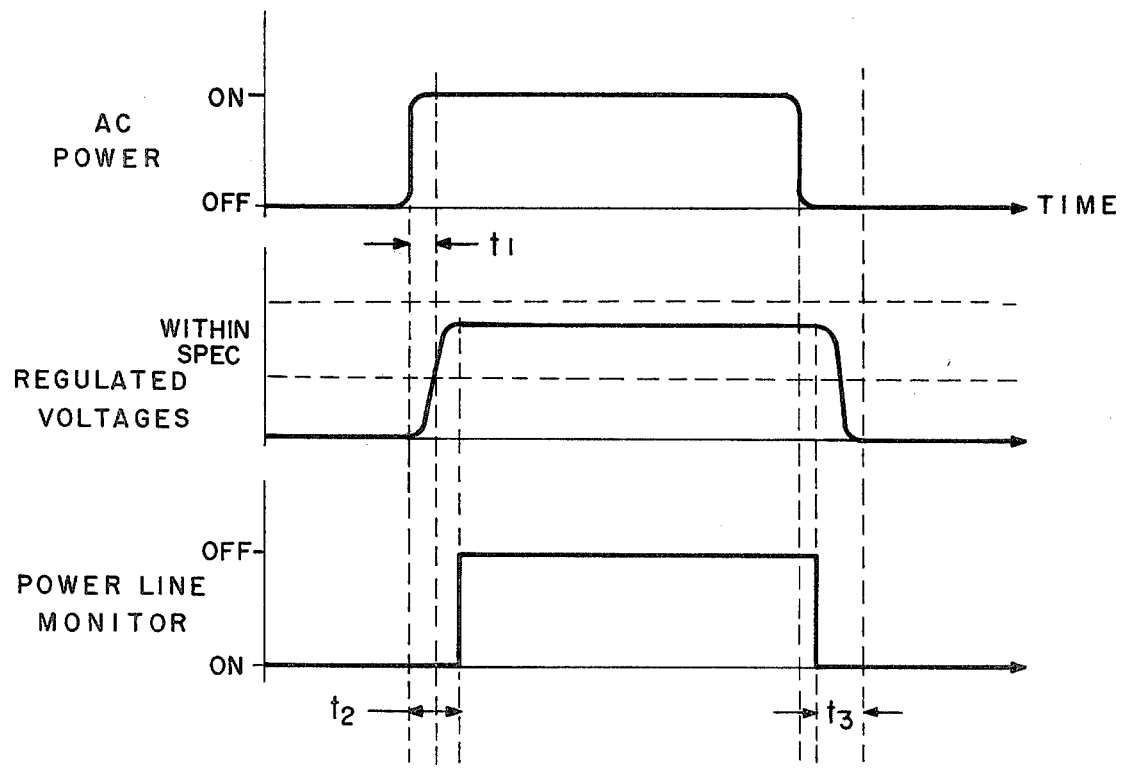
F I G. 2

POWER MONITOR FOR USE IN STARTING AND STOPPING A DIGITAL ELECTRONIC SYSTEM

BACKGROUND OF THE INVENTION

This invention relates to an improved power monitor for use in starting and stopping a digital electronic system which has data storage, and more particularly to a monitor for providing a low impedance path to ground for initializing the digital system at A.C. power turn-on and A.C. power turn-off.

Data processing systems require a number of carefully regulated D.C. voltages which must be within certain specified ranges in order for the electronics to operate properly. For example, the regulated 5 volt supply must be within ±5% for a reliable operation. In a typical digitally-based logic system, initialization following turn-on is enabled by a signal which presents a low impedance path to ground. This signal is held for several milliseconds following power turn-on to insure that the various regulated D.C. output voltages have reached their nominal values and that the logic circuits are started in defined states. In prior art devices of which applicant is aware, this function is provided by the closing of relay contacts which provide a low impedance path to ground.

In addition to a requirement for providing an initializing signal at turn-on, an initializing signal is in accordance with this invention also provided at power turn-off. The reason for this later requirement is that the regulated power supply will continue to provided output voltages following power turn-off; however, these outputs will tend to degradate from their nominal values and cause erroneous operation of the logic circuits.

The object of the present invention is to provide a relatively simple, inexpensive solid state circuit which provides a low impedance initializing signal when power is turned on and when power is turned off.

Briefly, the present invention contemplates the provision of a low impedance FET switch coupled between the digital electronic system and ground. This FET is coupled to the regulated D.C. power supply and conducts following A.C. power turn-on until cut-off bias is applied to its base. This bias is divided via a delay return from the regulated D.C. supply. At A.C. turn-off, the cut-off bias is removed from the base of the FET before the outputs of the regulated D.C. supply fall out of the range of acceptability.

BRIEF DESCRIPTION OF THE DRAWINGS

A better understanding of the present invention may be had when the following detailed description is read in connection with the accompanying drawings, in which:

FIG. 1 is a block diagram illustrating the circuit location of a power line monitor in accordance with this invention with respect to the A.C. main input, a regulated D.C. power supply, and the data processing electronics;

FIG. 2 is a timing diagram showing the relationships in time of the power line monitor signals with respect to the A.C. power and the regulated voltage outputs;

DESCRIPTION OF THE PREFERRED EMBODIMENT

Detailed Description

Figure 3:
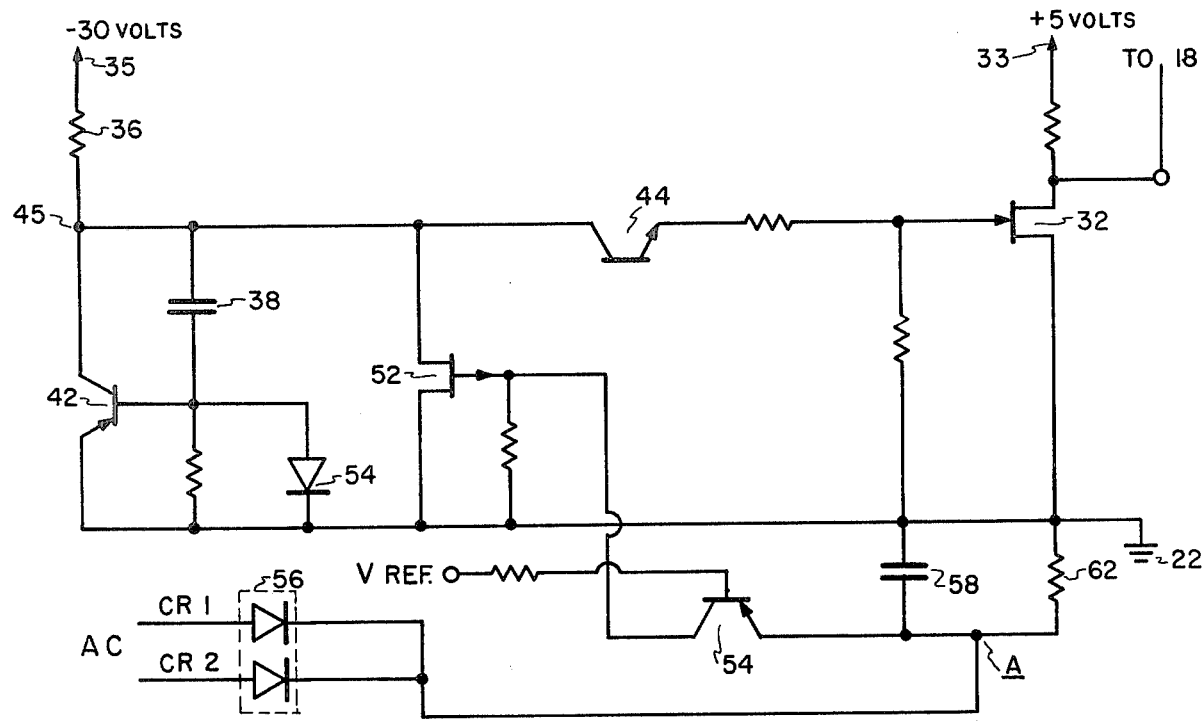
FIG. 3 is a detail schematic diagram of the power line monitor of this invention.

Referring now to FIG. 1 of the drawings, the primary 10 of a transformer is coupled to the A.C. power mains typically 220 volts or 120 volt, 60 cycle power mains. The transformer has a number of secondaries 12, one for each voltage desired. For example, as illustrated in FIG. 1, +5 volts, −5 volts, +12 volts, and −30 volts. These secondaries are coupled via a rectifier 14 as the input of regulated D.C. voltage power supply 16 of a type known in the art suitable for providing the necessary voltages to operate a data processing electronics system 18. These voltages are carefully regulated with respect to a ground or common 22. It will be appreciated that power supplies 16 of the type commonly used in the prior art inherently require several milliseconds to produce D.C. output voltages within acceptable ranges following power turn-on. Similarly, these voltage will remain within their specified ranges following A.C. power turn-off for several milliseconds.

The regulated power supply outputs are coupled to the data processing electronics system 18 as is conventional in the art.

Referring now to FIG. 2 as well as FIG. 1, following the turn-on of A.C. power 10, the regulated output voltages of the regulator 16 will be within specification (typically ±5%) within an interval $t_1$ following power turn-on. Advantageously, the initializing signal has a duration $t_1+t_2$ to insure that the regulated voltages are within specification prior to operation of the electronics 18.

In addition, the powerline monitor 24 returns the data processing electronics to ground through the same low impedance path for an interval $t_3$ prior to loss of requested voltage. It should be noted that this return to ground signal occurs before the regulated voltage outputs of the power supply 16 fall out of specification.

Referring now to FIG. 3, the digital electronics 18 is coupled to the drain of a depletion-mode field effect transistor which serves as a low impedance switch to connect the digital electronics system to a ground or common 22 during initialization and immediately after an A.C. power interruption. The drain of the FET 32 is coupled to a terminal 33 to which is applied suitable bias voltage obtained from the regulated supply (e.g. ±5 volts) and the source is connected to ground 22.

The gate of the FET 32 is coupled to a terminal 35 to which a voltage also derived from the regulated power is coupled through an RC time delay network comprised of resistor 36 and capacitor 38. The charging current for capacitor 38 flows through the base emitter transistor 42 so that a relatively low value of capacitance can be used while still achieving a relatively large time delay. As will be appreciated by those skilled in the art, the effective capacitance of the capacitor 38 is approximately equal to the actual capacitance multiplied by the gain of the transistor 42.

An optional transistor 44, which acts as a breakdown diode, couples the bias voltage to the gate of the transistor 32. As the capacitor 38 charges, the potential of point 45 goes negative with respect to ground until transistor 44 conducts. When the potential on the site of FET 32 falls through zero volts and goes negative, FET stops conducting. The potential at its drain rises providing an output signal delayed with respect to A.C. power turn-on.

The discharge path for the capacitor 38 is through a second FET 52 and a diode 54. The source and drain of the FET 52 are connected across the capacitor and diode so that, when the FET conducts, it removes the bias from the base of the FET 32.

FET 32 is controlled by a transistor 54 whose collector is connected to the base of FET 32 and whose emitter is connected to the A.C. power supply via a full wave rectifier 56 and an RC network comprised of capacitor 58 and resistor 62. The base of transistor 54 is connected to a suitable low voltage reference derived from the regulated power supply.

In operation, following energization of the A.C. mains, the FET 32 remains in its low impedance state until the potential at its gate crosses zero and becomes slightly negative. Even though a negative voltage from the regulated power supply appears at terminal 35, it does not drive the base of FET 32 negative with respect to the ground 22 until a time delay determined by the RC network 36–38 allows a build-up of potential. When this potential breaks down transistor 44, a negative bias is thereafter applied to FET 32 and switches to its high impedance state and remains there so long as a negative bias is applied to its base.

Figure 4:
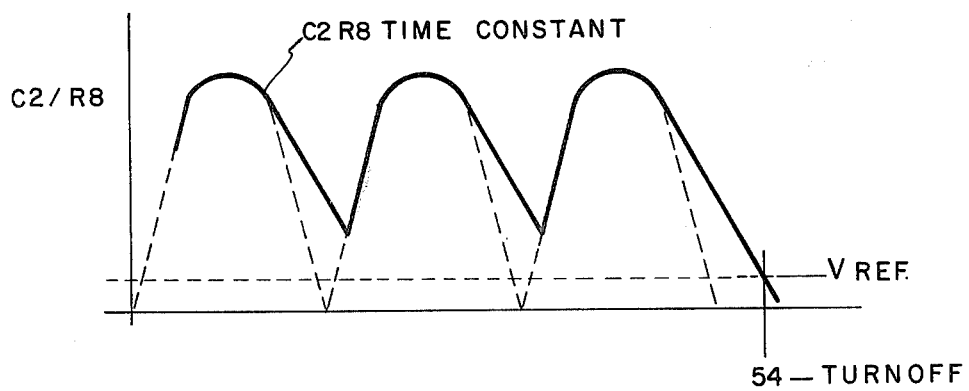
FIG. 4 is a typical wave form of the point designated A in FIG. 3.

Referring to FIG. 4 as well as FIG. 3, when A.C. power is applied, a rectified and partially filtered voltage derived from the A.C. mains is very rapidly available. Transistor 54 compares this rectified voltage with a reference voltage (V REF) which is chosen to be less than the rectified voltage turning on transistor 54. When transistor 54 is on, sufficient bias is applied to the gate of depletion mode field effect transistor 52 to turn it off. The potential of point A remains above the reference potential owing to the action of the RC network 62–58 so long as the A.C. is continuously applied. In this condition, transistor 54 conducts and applies a positive bias to FET 52 which maintains this FET in its high impedance state.

When the A.C. power is discontinued, the potential at point A falls rapidly below the reference due to the small time constant of the RC network 58–62. Conduction through transistor 54 stops removing the bias FET 52. It rapidly assumes its low impedance state and provides a low impedance discharge path for capacitor 38. Capacitor 38 rapidly discharges through FET 52 and diode 54 until the potential rises above that required to sustain conduction through transistor 44. With its negative bias removed, FET 32 assumes a low impedance state connecting the electronics system to ground 22. It should be noted that owing to the small time constant of capacitor 38 discharging through FET 52 and diode 54, switching occurs prior to the time when the regulated voltages stray from their nominal values.

Accordingly, it may be seen that there has been provided, in accordance with the present invention, an Improved Power Monitor for Use in Starting and Stopping a Digital Electronic System.

The embodiments of the invention in which an exclusive property or privilege is claimed are defined as follows:

1. In a digital electronic system operative within a predetermined acceptable regulated range of a d.c. power supply energized from an a.c. source, a power monitor for providing a low impedance path to ground to initialize the digital electronic system at a.c. power turn-on and a.c. power turn-off, comprising in combination:
   a first semiconductor switch coupled between the digital electronic system and ground, said semiconductor switch being in a closed position in the absence of a bias signal;
   a bias signal source derived from said regulated d.c. power supply;
   means for coupling said bias signal to open said first semiconductor switch, said bias signal coupling means including a resistive-capacitive network introducing a delay between the time the regulated d.c. potential reaches a value sufficient to provide said bias signal and the time said switch opens;
   a second semiconductor switch connected to said a.c. power source and providing a low impedance path in its closed condition to remove said bias signal from said first switch; and
   means for detecting the absence of a.c. power and the consequential loss of the regulated d.c. bias to said system within a one-half cycle interval of said a.c. power signal for producing an output signal to close said second switch thereby removing the said bias signal from said first switch; whereby said digital electronic system is coupled to ground in response to a turn-off of said a.c. power prior in time to the regulated d.c. bias varying from its acceptable operating range.

* * * * *